(12) United States Patent
Wegner (10) Patent No.: US 12,018,833 B1
(45) Date of Patent: Jun. 25, 2024

(54) ASYMMETRIC LED OPTIC FOR ASYMMETRIC LUMINAIRE APPLICATIONS

(71) Applicant: CreeLED, Inc., Durham, NC (US)

(72) Inventor: Scott Wegner, Boulder, CO (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 18/216,879

(22) Filed: Jun. 30, 2023

(51) Int. Cl.
*F21V 5/04* (2006.01)
*F21Y 115/10* (2016.01)

(52) U.S. Cl.
CPC ............ *F21V 5/048* (2013.01); *F21Y 2115/10* (2016.08)

(58) Field of Classification Search
CPC ... F21V 5/048; F21V 5/00; F21V 5/02; F21V 5/04; F21V 5/045; F21Y 2115/10; H01L 23/28; H01L 23/31; G02B 2003/0093; G02B 3/00
See application file for complete search history.

(56) References Cited

U.S. PATENT DOCUMENTS

| | | | |
|---|---|---|---|
| 7,637,630 B2 | 12/2009 | Wilcox et al. | |
| 8,564,004 B2 | 10/2013 | Tarsa et al. | |
| 9,070,850 B2 | 6/2015 | Keller et al. | |
| 9,099,575 B2 | 8/2015 | Medendorp, Jr. et al. | |
| 9,172,012 B2 | 10/2015 | Andrews et al. | |
| 9,557,033 B2 | 1/2017 | Jacobson et al. | |
| 9,887,327 B2 | 2/2018 | Reiherzer et al. | |
| 2012/0106165 A1* | 5/2012 | Chang | F21V 5/048 362/311.02 |
| 2014/0159084 A1 | 6/2014 | Castillo et al. | |

* cited by examiner

*Primary Examiner* — Bao Q Truong
(74) *Attorney, Agent, or Firm* — Withrow & Terranova, P.L.L.C.

(57) ABSTRACT

Solid-state lighting devices, and more particularly, asymmetric light-emitting diode (LED) optic for asymmetric luminaire applications for LED packages are disclosed. The asymmetric LED optic can be a lens or other type of refractive element that has one or more indentations or other features that cause internal reflection such that some portion of the light exits a refractive element in a first direction and a portion may instead be refracted to exit the lens elsewhere. The LED package comprising these refractive elements can thus provide asymmetric illumination to a lighting area. One exemplary application could be street lighting, where light can be preferentially directed toward a roadway and away from houses or other areas away from the road.

20 Claims, 9 Drawing Sheets

ASYMMETRIC LED OPTIC FOR ASYMMETRIC LUMINAIRE APPLICATIONS

FIELD OF THE DISCLOSURE

The present disclosure relates to a solid-state lighting device, and more particularly to an asymmetric light emitting diode (LED) optic for asymmetric luminaire applications for LED packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination and automotive applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

The art continues to seek improved LEDs and solid-state lighting devices having desirable illumination characteristics capable of overcoming challenges associated with conventional lighting devices.

SUMMARY

The present disclosure relates to a solid-state lighting device, and more particularly to an asymmetric light emitting diode (LED) optic for asymmetric luminaire applications for LED packages. The asymmetric LED optic can be a lens or other type of refractive element that has one or more indentations or other features that cause internal reflection such that some portion of the light exits a refractive element in a first direction and a portion may instead be refracted to exit the lens elsewhere. The LED package comprising these refractive elements can thus provide asymmetric illumination to a lighting area. One exemplary application could be street lighting, where light can be preferentially directed toward a roadway and away from houses or other areas away from the road. The recess in the refractive element can have sidewalls that extend up from a base of the lens and converge at some point between a base of the refractive element and an outer circumference of the refractive element.

In an embodiment, an LED package can include an LED chip, and a refractive element mounted over the LED chip, wherein the refractive element comprises an indentation that defines a recess formed along a minor arc of a base of the refractive element, wherein sidewalls of the recess are configured to internally reflect at least some light emitted by the LED chip.

In an embodiment, the indentation extends through the refractive element in a direction normal to the base of the refractive element.

In an embodiment, the sidewalls of the recess converge at a point between a center of the base of the refractive element and the minor arc of the base of the refractive element.

In an embodiment, an angle formed by a convergence of the sidewalls is an acute angle with respect to the recess.

In an embodiment, at least some light incident on a sidewall of the recess from the LED chip internally reflects more than one time on the sidewall of the recess before exiting the refractive element.

In an embodiment, the sidewalls of the recess are straight.

In an embodiment, the sidewalls of the recess are at least one of convex, concave, or planar shaped.

In an embodiment, wherein a portion of the refractive element comprises a light-altering material.

In an embodiment, the refractive element is a hemisphere.

In an embodiment, the refractive element comprises cylindrical sidewalls and a curved top portion.

In an embodiment, the curved top portion is toroidal.

In an embodiment, the curved top portion is conical.

In an embodiment, the curved top portion is hemispherical.

In an embodiment, a first light emission intensity of light emitted from a first side of the refractive element with the recess is less than a second light emission intensity of light emitted from a second side of the refractive element opposite the recess.

In an embodiment, a lighting fixture can include a housing, and one or more LED packages mounted in the housing, wherein the one or more LED packages respectively include an LED chip and a refractive element mounted over the LED chip, wherein the refractive element comprises an indentation that defines a recess formed along a minor arc of a base of the refractive element, wherein sidewalls of the recess are configured to internally reflect at least some light emitted by the LED chip.

In an embodiment, a first side of the refractive element comprising the recess is mounted away from a lighting area, and wherein a second side of the refractive element opposite the recess is mounted towards the lighting area.

In an embodiment, the indentation extends through the refractive element in a direction normal to the base of the refractive element.

In an embodiment, the sidewalls of the recess converge at a point between a center of the base of the refractive element and the minor arc of the base of the refractive element.

In an embodiment, at least some light incident on a sidewall of the recess from the LED chip internally reflects more than one time on the sidewall of the recess before exiting the refractive element.

In an embodiment, a refractive element is provided that is configured to be mounted over a light source, wherein the refractive element comprises an indentation that defines a recess formed along a minor arc of a base of the refractive element, wherein sidewalls of the recess are configured to internally reflect at least some light emitted by the light source.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to a solid-state lighting device, and more particularly to an asymmetric light emitting diode (LED) optic for asymmetric luminaire applications for LED packages. The asymmetric LED optic can be a refractive element that has one or more indentations or other features that cause internal reflection such some portion of the light that would have exited the refractive element in a first direction is instead reflected to exit the lens elsewhere. It is to be appreciated that throughout the description, reference is made to a lens, but could be any optical element or refractive element. The LED package comprising these lenses can thus provide asymmetric illumination to a lighting area. One exemplary application could be street lighting, where light can be preferentially directed toward a roadway and away from houses or other areas away from the road. The recess in the lens can have sidewalls that extend up from a base of the lens and converge at some point between a base of the lens and an outer circumference of the lens.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 K to 10,000 K. In certain embodiments, lumiphoric materials having cyan, green, amber, yellow, orange, and/or red peak emission wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations.

Light emitted by the active layer or region of an LED chip is initiated in all directions. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer is arranged between the metal reflector layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be arranged for flip-chip mounting on another surface.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, or otherwise redirect light. For light-reflective materials, the light-altering material may include at least one of fused silica, fumed silica, titanium dioxide ($TiO_2$), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast.

In certain applications, LED devices as disclosed herein may be well suited to provide outdoor lighting such as street lighting, facility lighting, and other lighting applications in which asymmetric illumination patterns may be desirable. In general lighting applications, LED devices as disclosed herein may be configured to provide modules, systems, and fixtures that are capable of providing one or more different emission colors or CCT values, such as one or more of warm white (e.g., 2700 Kelvin (K)-3000 K), neutral white (e.g., 3500 K-4500 K), and cool white (5000 K-6500 K).

Figure 1:
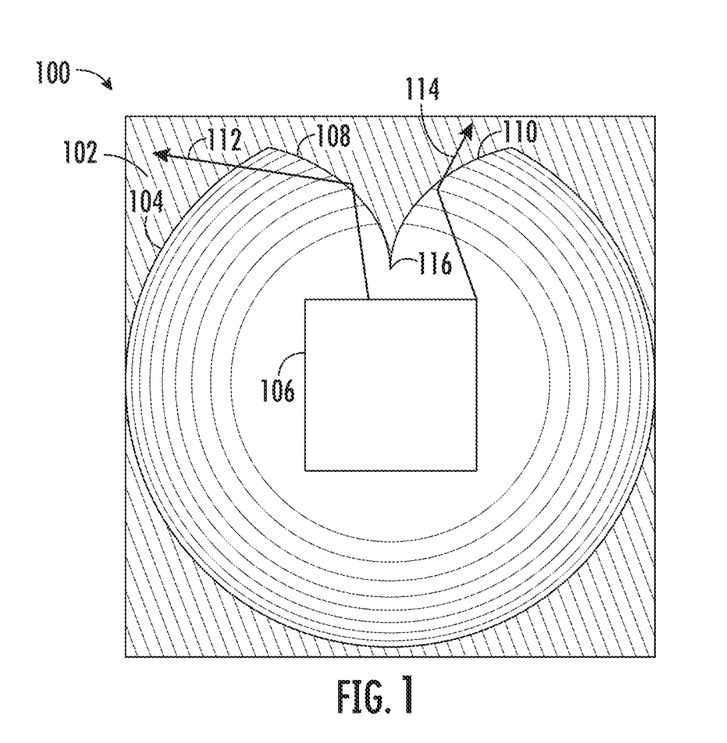
FIG. 1 is an exemplary overhead view of a light emitting diode (LED) package with an asymmetric optic according to one or more embodiments of the present disclosure.

FIG. 1 is an exemplary overhead view of an LED package 100 with a lens 104 that is an asymmetric optic according to one or more embodiments of the present disclosure.

In the embodiment shown in FIG. 1, an LED chip 106 can be mounted on a substrate 102, and a lens 104 can be mounted over the LED chip 106. In the embodiment shown in FIG. 1, there is a single LED chip 106, but in other embodiments, there could be a plurality of LED chips. In an embodiment, the lens 104 can be generally a hemispherical shape or somewhat toroidal in shape with a dip near a center of the lens 104, that also has an indentation on one side where sidewalls 108 and 110 can diverge from the circumferential boundary of the base of the lens 104 and form a recess. The recess can be characterized as the area in between the sidewalls 108 and 110 the minor arc that is formed between where the sidewalls 108 and 110 diverge from the general circumferential boundary of the base of the lens 104. In an embodiment the sidewalls 108 and 110 can converge at a point 116 that is somewhere in between the minor arc and the center of the base of the lens 104. In an embodiment, the point 116 can be between the minor arc and an outer edge of the LED chip 106.

In an embodiment, the lens 104 can be used with any light source, and not just an LED chip. For example, the lens 104 could be used in conjunction with an incandescent bulb, fluorescent bulb, sodium vapor lamp, or any other bulb or lamp commonly used in lighting applications.

At least some of the light that is emitted by the LED chip 106 can internally reflect off the sidewalls 108 and 110 thus causing less light to be emitted on the side of the lens 104 that has the recess. For example, as shown in FIG. 1, light rays 112 and 114 reflect off the sidewalls 108 and 110 respectively and are diverted away from the side of the lens 104 with the indentation. In an embodiment, the light rays from the central region of the LED chip 106 may be more likely to reflect off of sidewalls 108 and 110. Depending on the angle of light emitted from the LED chip 106, and the configuration of the sidewalls, some of the light that may have exited from the lens 104 on the side of the indentation can be redirected in a variety of directions, thus causing an increase in light intensity in directions other than the direction of the indentation. In an embodiment, the lens 102 could include a material within the lens 102 that is light altering such as a light reflective material or light diffusing material in a portion of the lens 102 to cause a further increase of light being emitted out of the lens 102 in directions other than the direction of the indentation, or a reduction in light emitted from the side of the lens 102 with an indentation.

In FIG. 1, a single LED chip 106 is shown in LED package 100, but in other embodiments, there could be a plurality of LED chips. Additionally, while sidewalls 108 and 110 are shown as being curved, in other embodiments, the sidewalls 108 and 110 could be straight, stepped, or curved in different ways (e.g., convex or concave, or planar). In an embodiment, the recess could include a single sidewall that was curved. In other embodiments, sidewalls 108 and 110 may not converge at a single point (e.g., point 116), but instead intersect with another sidewall, or could form a continuous edge. In the embodiment shown in FIG. 1, while the lens 104 is radially asymmetric, but translationally symmetric, in other embodiments, the lens 104 could be both rotationally and translationally asymmetric. For example, the sidewalls 108 and 110 could have different lengths, or shapes, and the recess could be asymmetric or irregular.

In an embodiment, the light rays 112 and 114 could reflect internally off the sidewalls 108 and 110, more than one time. For example, if light ray 112 was incident on the surface of the sidewall 108 at a small enough angle, and the sidewall 108 was curved as it is shown in FIG. 1, the reflected light ray 112 could reflect off the sidewall 108 or boundary of the lens 104 at least one additional time before exiting the lens 104.

Figure 2:
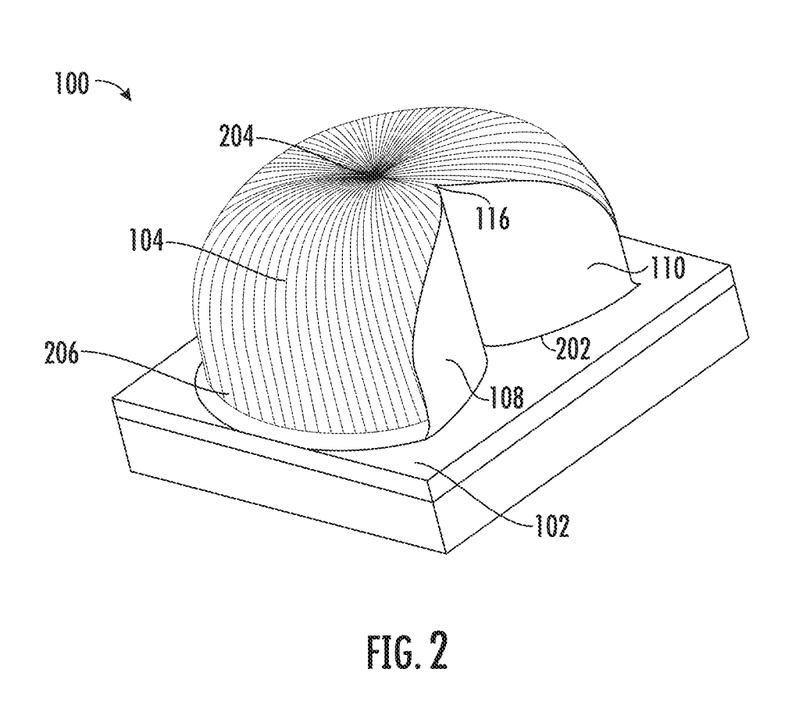
FIG. 2 is an exemplary isometric view of an LED package with an asymmetric optic according to one or more embodiments of the present disclosure.

FIG. 2 is an exemplary isometric view of an LED package 100 with an asymmetric optic according to one or more embodiments of the present disclosure.

In the embodiment shown in FIG. 2, the lens 104 has a revolved shape with a sidewall 206 with a curved or generally hemispherical top portion or toroidal top portion. The recess formed by sidewalls 108 and 110 can extend from a base 202 of the lens 104 all the way to the top of the lens 104. The indentation can extend in a direction normal to base 202 of the lens 104 to a top of the lens 104. As such, in FIG. 2, the point 116 where the sidewalls 108 and 110 converge can actually form a crease along the recess from the base 202 of the lens 104 to the top of the lens 104.

In other embodiments, the recess may not extend all the way to the top and could only be formed in part of the lens 104, such as a recess that corresponds to the revolved sidewall 206.

In an embodiment, the top hemispherical portion of the lens 104 can also include an indentation 204. The indentation 204 in FIG. 2 is relatively small, but in other embodiments, the indentation 204 can be deeper, extending as far as at least halfway to the base 202 of the lens 104 or more, thus the shape of the lens 104 can be somewhat of a toroid. In other embodiments, the lens 104 could have a taller or shorter revolved sidewalls 206. In other embodiments, the lens 104 may have no revolved sidewalls 206 and immediately form the hemispherical, conical, or toroidal shape from the base 202 of the lens 104.

While the light rays 112 and 114 are shown in FIG. 1, reflecting off the sidewalls 108 and 110 in an plane parallel to the LED chip 106 and base of the lens 104, the light rays can reflect off the sidewalls 108 and 110 with some vertical translation as well, with a light ray emanating from the LED chip 106 near a base 202 of the lens 104, and then exiting the lens 104 near a top of the lens 104.

Figure 3:
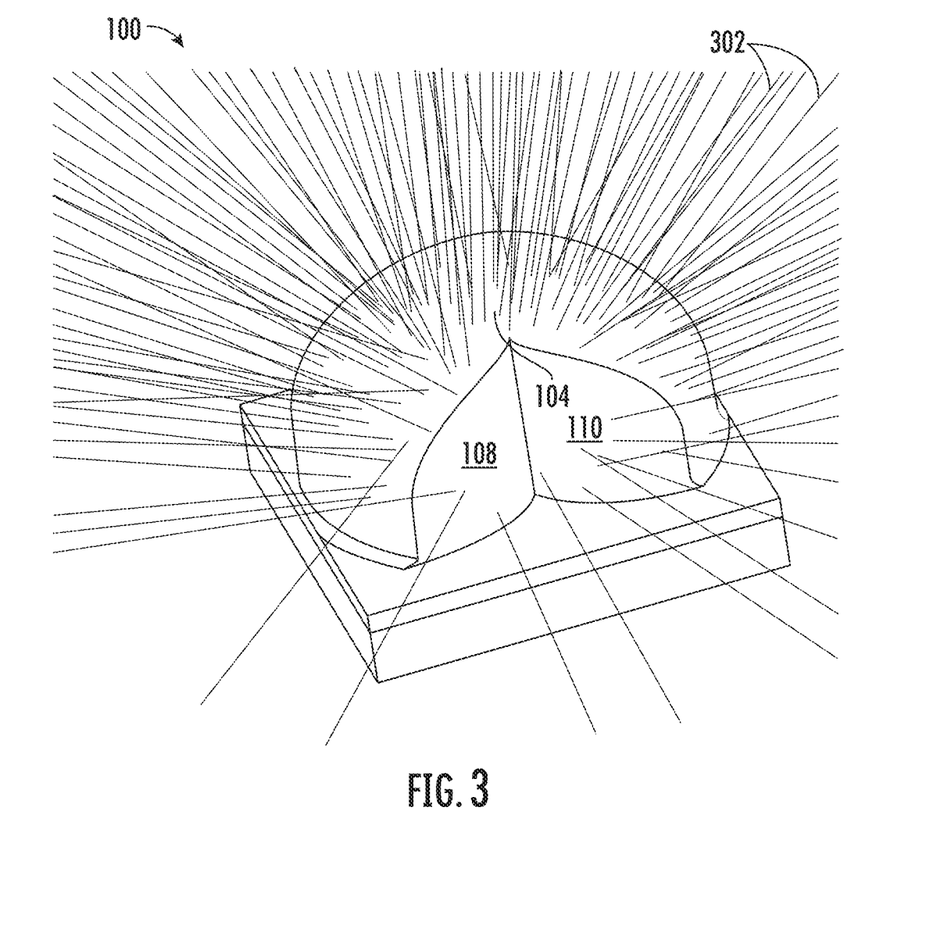
FIG. 3 is an exemplary isometric view of the LED package from FIG. 2 with exemplary light rays according to one or more embodiments of the present disclosure.

FIG. 3 is an exemplary isometric view of the LED package 100 from FIG. 2 with exemplary light rays 302 according to one or more embodiments of the present disclosure.

The light rays 302 depicted in FIG. 3 are based on a simulation of an exemplary model of the LED package 100. As seen in FIG. 3, the light rays 302 are emitted from most sides/areas of the lens 104 with a higher density than the light rays 302 emitted from side of the lens 104 with the recess. The recessed side has a noticeable decrease in light flux distribution of around 10-25%. This reduction in light emitted on the recessed side can be useful in applications where directional lighting is desirable, such as in street lighting, where increased lighting is preferable towards the street and in both directions up and down the street, and reduced lighting off the street. This has the advantage of both improving the efficiency of the lighting fixture by increasing light flux in a desired lighting area without the need for secondary optics or reflectors, and in reducing the lighting directed towards non-desirable areas, such as residential areas alongside the street.

Figure 4:
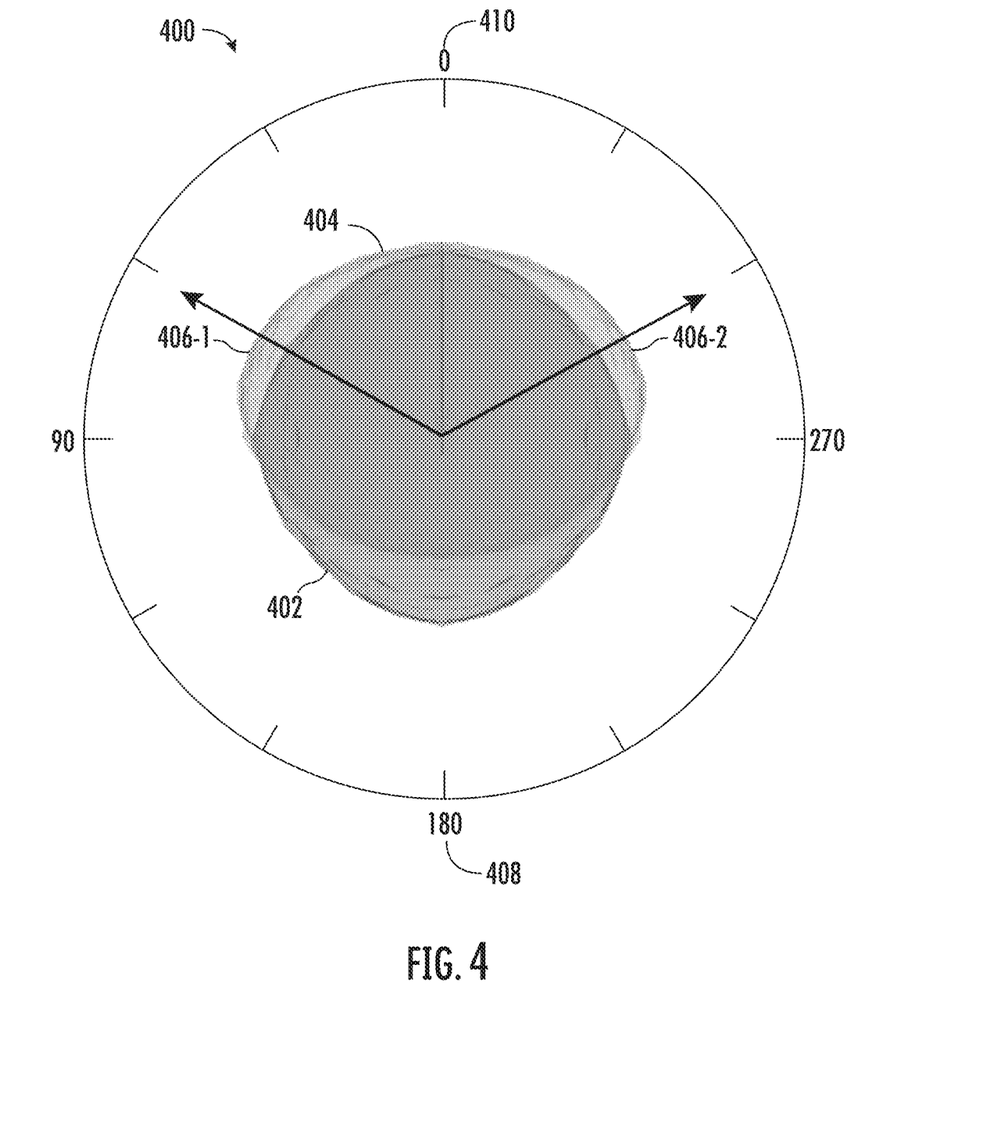
FIG. 4 is a graph showing a light distribution comparison of an LED package with a symmetrical refractive element and an LED package with an asymmetric lens according to one or more embodiments of the present disclosure.

FIG. 4 is a graph 400 showing light distribution comparison of a an LED package with a symmetrical refractive element and an LED package with an asymmetric lens according to one or more embodiments of the present disclosure. The light distribution pattern 402 is the light distribution for a convention LED package with a symmetric lens, where the light is distributed roughly evenly around 360 degrees. By contrast, the light distribution pattern 404 is for the LED package 100 disclosed herein with an asymmetric lens 104, and as can be seen has a decreased light intensity at 180 degrees relative to the light distribution pattern 402, but slight increased intensity at 0 degrees, and increased distribution for side loves 406-1 and 406-2 at roughly 60 degrees and 300 degrees.

Figure 5A:
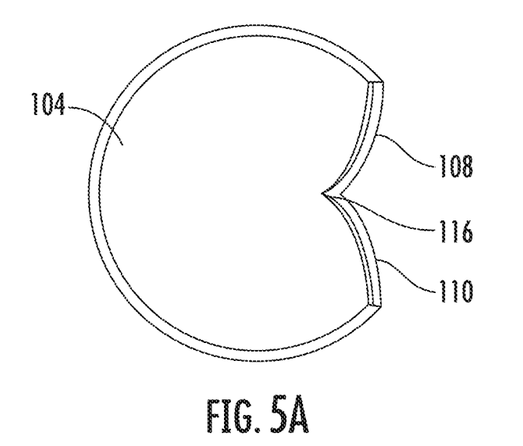
FIGS. 5A, 5B, and 5C are top down views of asymmetric lenses with different recess shapes according to one or more embodiments of the present disclosure.
Figure 5B:
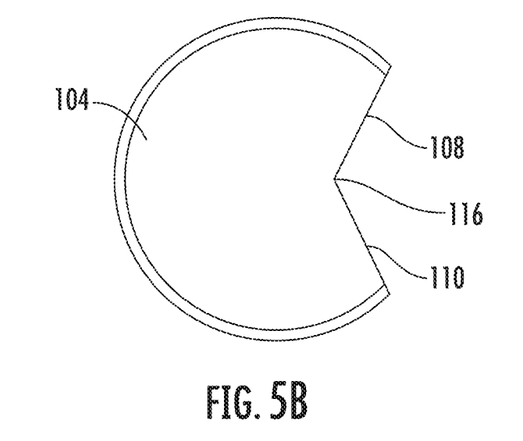
Figure 5C:
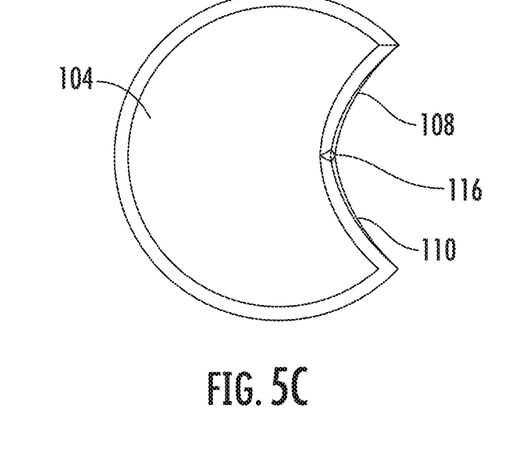

FIGS. 5A, 5B, and 5C are top down views of asymmetric lenses 104 with different recess shapes according to one or more embodiments of the present disclosure. As described above with regard to FIG. 1, the lens 104 can have sidewalls of different shapes and in FIG. 5A, the lens 104 can have sidewalls 108 and 110 that converge at point 116 while being convex with respect to the lens 104, while in FIG. 5C, the sidewalls 108 and 110 can be concave with respect to the lens 104. In FIG. 5B, the sidewalls 108 and 110 are shown as being straight or planar. It is to be appreciated that in other embodiments, one sidewall could curve in one direction and the other sidewall curved in a different direction, or one sidewall be straight while another sidewall is curved. Additionally, in some embodiments, as in FIG. 5A, an angle formed by a convergence of the sidewalls 108 and 110 is an acute angle (<90 degrees) with respect to the recess, while in other embodiments, such as in FIG. 5B or 5C, the angle could be obtuse (>90 degrees).

Figure 6A:
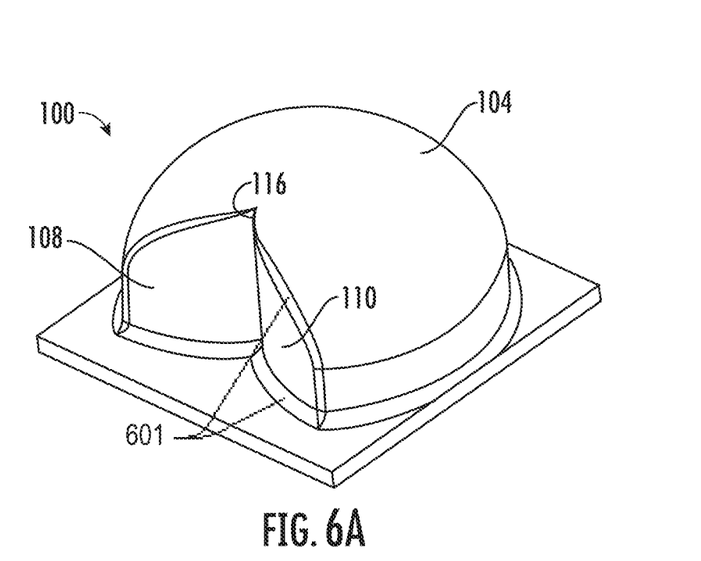
FIGS. 6A, 6B, 6C, and 6D are isometric views of asymmetric lenses with different recess shapes according to one or more embodiments of the present disclosure.

FIGS. 6A, 6B, 6C, and 6D are isometric views of asymmetric lenses with different recess shapes according to one or more embodiments of the present disclosure. In FIG. 6A, the lens 104 is comparable to the lens 104 from FIG. 2, except with no dimple 204 in FIG. 6A. Additionally, the lens 104 in FIG. 6A has a beveled edge 601 on the face of the side walls and around the base of the lens 104.

Figure 6B:
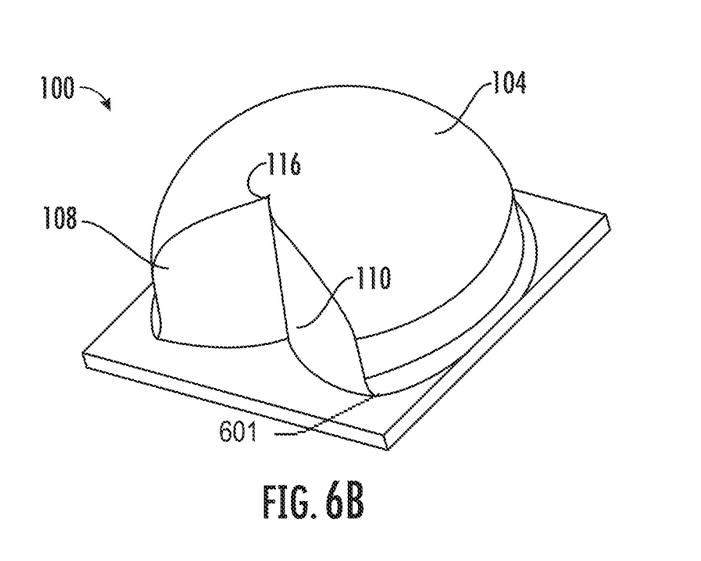

In FIG. 6B, the lens 104 does not have the beveled edge 601 on the sidewalls, but does include the beveled or filleted edge 601 around the base of the lens 104.

Figure 6C:
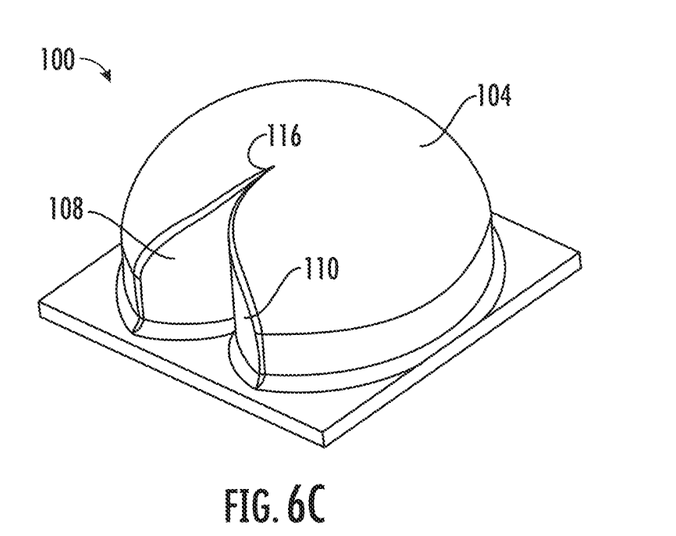

In FIG. 6C, which is comparable to the embodiment in FIG. 6A, except that the angle at which the sidewalls 108 and 110 converge at is more acute than in the other embodiments and occurs closer to the center of the base of the lens 104.

Figure 6D:
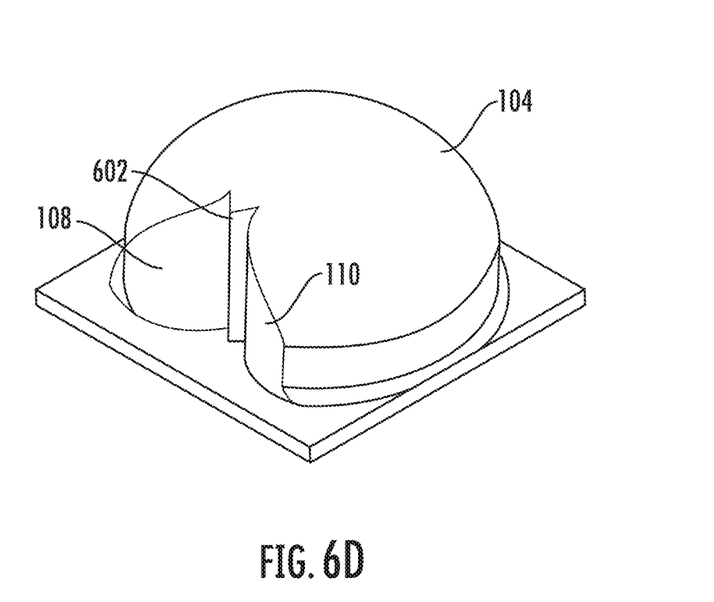

In FIG. 6D, the sidewalls 108 and 110 do not converge at point or crease 116, and instead there is a feature 602 that extends into the recess from the lens 104 and proceeds from the base of the lens 104 to the top of the lens 104. This feature 602 can further modify the light emission pattern from the lens 104.

Figure 7:
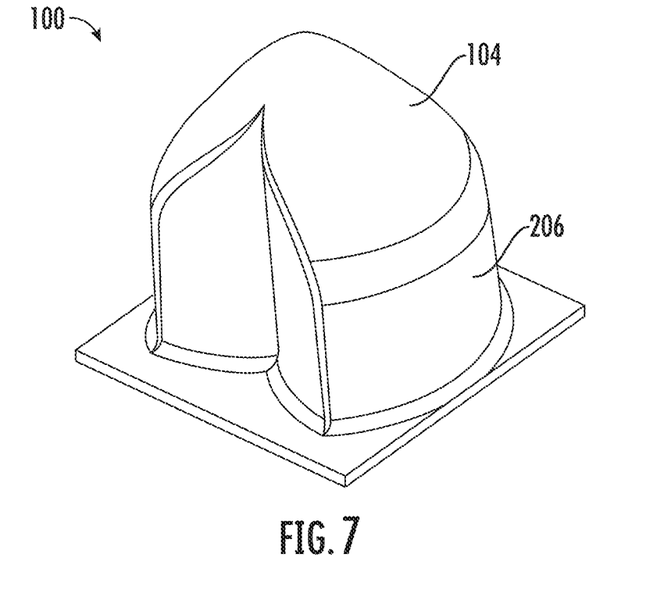
FIG. 7 is an isometric view of another asymmetric lens with a non-hemispherical shape according to one or more embodiments of the present disclosure.

FIG. 7 is an isometric view of another asymmetric lens with a non-hemispherical shape according to one or more embodiments of the present disclosure.

The lens 104 in FIG. 7 can have a cylindrical or conical base with revolved sidewalls 206, and then a conical top portion of the lens. In other embodiments, the lens could be conical with no cylindrical sidewalls 206.

Figure 8:
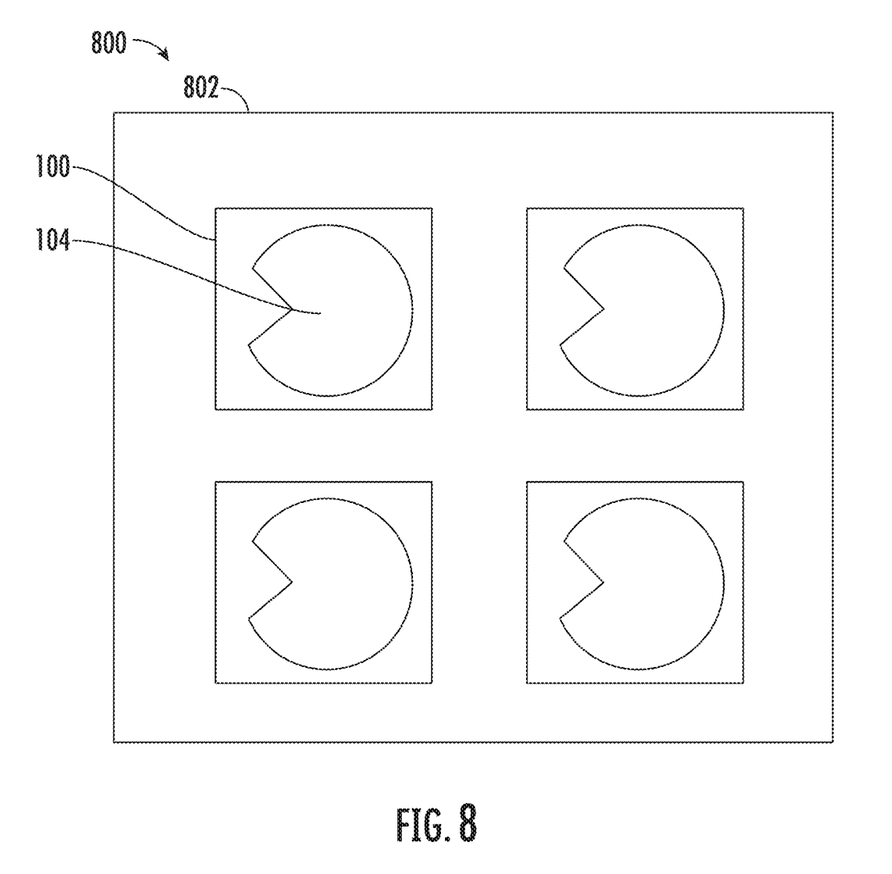
FIG. 8 is a block diagram of a lighting fixture with several LED packages with asymmetric lenses according to one or more embodiments of the present disclosure.

FIG. 8 is a block diagram of a lighting fixture 802 with several LED packages 100 with asymmetric lenses 104 according to one or more embodiments of the present disclosure. The lighting fixture 802 can be mounted on a light pole or other structure and be configured to provide lighting to a desired lighting area, e.g., a roadway or street. The lighting fixture 802 could comprise one or more of the LED packages 100. In the embodiment shown in FIG. 8, the lighting fixture 802 comprises four LED packages 100, but there could be other numbers of LED packages 100 in other embodiments. The lighting fixture 802 can be mounted such that the recesses of the lenses 104 are directed away from the desired lighting area to reduce the light emitted in undesirable directions, and improve the lighting efficiency of the lighting fixture on the desired lighting area.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package, comprising:
   an LED chip; and
   a refractive element mounted over the LED chip, wherein the refractive element comprises an indentation that defines a recess formed along a minor arc of a base of the refractive element, wherein sidewalls of the recess are configured to internally reflect at least some light emitted by the LED chip.

2. The LED package of claim 1, wherein the indentation extends through the refractive element in a direction normal to the base of the refractive element.

3. The LED package of claim 1, wherein the sidewalls of the recess converge at a point between a center of the base of the refractive element and the minor arc of the base of the refractive element.

4. The LED package of claim 1, wherein an angle formed by a convergence of the sidewalls is an acute angle with respect to the recess.

5. The LED package of claim 1, wherein at least some light incident on a sidewall of the recess from the LED chip internally reflects more than one time on the sidewall of the recess before exiting the refractive element.

6. The LED package of claim 1, wherein the sidewalls of the recess are straight.

7. The LED package of claim 1, wherein the sidewalls of the recess are at least one of convex, concave, or planar shaped.

8. The LED package of claim 1, wherein a portion of the refractive element comprises a light-altering material.

9. The LED package of claim 1, wherein the refractive element is a hemisphere.

10. The LED package of claim 1, wherein the refractive element comprises cylindrical sidewalls and a curved top portion.

11. The LED package of claim 10, wherein the curved top portion is toroidal.

12. The LED package of claim 10, wherein the curved top portion is conical.

13. The LED package of claim 10, wherein the curved top portion is hemispherical.

14. The LED package of claim 1, wherein a first light emission intensity of light emitted from a first side of the refractive element with the recess is less than a second light emission intensity of light emitted from a second side of the refractive element opposite the recess.

15. A lighting fixture, comprising:
    a housing;
    one or more light-emitting diode (LED) packages mounted in the housing, wherein the one or more LED packages, respectively, comprise:
    an LED chip; and
    a refractive element mounted over the LED chip, wherein the refractive element comprises an indentation that defines a recess formed along a minor arc of a base of the refractive element, wherein sidewalls of the recess are configured to internally reflect at least some light emitted by the LED chip.

16. The lighting fixture of claim 15, wherein a first side of the refractive element comprising the recess is mounted away from a lighting area, and wherein a second side of the refractive element opposite the recess is mounted towards the lighting area.

17. The lighting fixture of claim 15, wherein the indentation extends through the refractive element in a direction normal to the base of the refractive element.

18. The lighting fixture of claim 15, wherein the sidewalls of the recess converge at a point between a center of the base of the refractive element and the minor arc of the base of the refractive element.

19. The lighting fixture of claim 15, wherein at least some light incident on a sidewall of the recess from the LED chip internally reflects more than one time on the sidewall of the recess before exiting the refractive element.

20. A refractive element configured to be mounted over a light source, wherein the refractive element comprises an indentation that defines a recess formed along a minor arc of a base of the refractive element, wherein sidewalls of the recess are configured to internally reflect at least some light emitted by the light source.

* * * * *

UNITED STATES PATENT AND TRADEMARK OFFICE
CERTIFICATE OF CORRECTION

| | | |
|---|---|---|
| PATENT NO. | : 12,018,833 B1 | Page 1 of 1 |
| APPLICATION NO. | : 18/216879 | |
| DATED | : June 25, 2024 | |
| INVENTOR(S) | : Scott Wegner | |

It is certified that error appears in the above-identified patent and that said Letters Patent is hereby corrected as shown below:

In the Specification

In Column 5, Line 36, replace "Ill nitride-based" with --III nitride-based--.

In Column 5, Line 36, replace "Group Ill nitrides" with --Group III nitrides--.

In Column 5, Line 38, replace "Group Ill of the" with --Group III of the--.

Signed and Sealed this
Twenty-third Day of July, 2024

Katherine Kelly Vidal
*Director of the United States Patent and Trademark Office*